United States Patent [19]

Smith

[11] 4,336,295
[45] Jun. 22, 1982

[54] METHOD OF FABRICATING A TRANSPARENT METAL OXIDE ELECTRODE STRUCTURE ON A SOLID-STATE ELECTROOPTICAL DEVICE

[75] Inventor: Frank T. J. Smith, Fairport, N.Y.

[73] Assignee: Eastman Kodak Company, Rochester, N.Y.

[21] Appl. No.: 219,167

[22] Filed: Dec. 22, 1980

[51] Int. Cl.³ .................. C23F 1/02; H01L 21/306
[52] U.S. Cl. ............................... 428/195; 156/662; 156/664; 156/667; 156/651; 156/656; 156/657; 357/65; 357/68; 357/71; 428/209; 428/901
[58] Field of Search ............ 156/662, 664, 667, 651, 156/656, 657; 428/195, 209, 901; 357/65, 68, 71

[56] References Cited

U.S. PATENT DOCUMENTS

| | | | |
|---|---|---|---|
| 3,740,280 | 6/1973 | Ronen | 156/11 |
| 3,904,453 | 9/1975 | Revesz et al. | 156/3 |
| 3,928,658 | 12/1975 | van Boxtel et al. | 427/108 |
| 3,941,630 | 3/1976 | Larrabee | 156/13 |
| 4,012,767 | 3/1977 | Brown et al. | 357/71 |
| 4,139,443 | 2/1979 | Sakurai | 204/192 |
| 4,172,004 | 10/1979 | Alcorn et al. | 156/643 |
| 4,178,403 | 12/1979 | Sakurai et al. | 428/209 |
| 4,182,647 | 1/1980 | Yoshihara et al. | 430/314 |
| 4,184,909 | 1/1980 | Chang et al. | 156/643 |

OTHER PUBLICATIONS

"Charge-Coupled Area Image Sensor Using Three Levels of Polysilicon" by C. H. Sequin et al., IEEE. Transaction on Electronic Devices, vol. ED21, No. 11, Nov. 1974.

Primary Examiner—Marion McCamish
Attorney, Agent, or Firm—Thomas H. Close

[57] ABSTRACT

A method of fabricating an electrode structure of transparent metal oxide on a solid-state electrooptical device is disclosed. A layer of conductive transparent metal oxide is deposited on the surface of the device. Thereafter, the transparent conductive layer is covered with a layer of pattern metal that forms a good electrical contact with the transparent metal oxide and is etchable independently of the transparent metal oxide. Portions of the pattern metal are etched away to define the desired electrode pattern using a photolithographic technique and an etchant that attacks the pattern metal but does not substantially attack the transparent metal oxide layer. Portions of the transparent metal oxide layer not covered by the pattern metal are removed using an etchant that attacks the transparent metal oxide but does not substantially attack the pattern metal. Portions of the remaining pattern metal are removed from imaging areas of the device, leaving pattern metal in the peripheral areas where electrical connections to the electrodes are to be located, using photolithographic techniques and the etchant that attacks the pattern metal but not the transparent metal oxide.

In the preferred embodiment, the pattern metal comprises chromium, and to complete the circiut and form bonding pads, a final metallization layer (e.g. gold) is deposited over the structure, and the structure is baked to adhere the final metal to the remaining portions of the chromium. Finally, portions of the final layer of metal are removed leaving the conductor pattern and the bonding pads.

10 Claims, 16 Drawing Figures

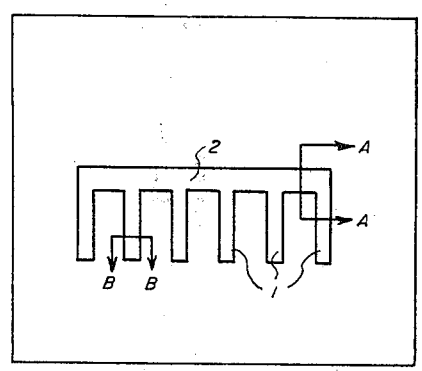
FIG. 1a
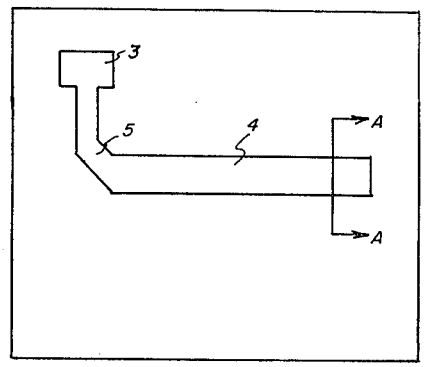
FIG. 1b
FIG. 2a    FIG. 2b
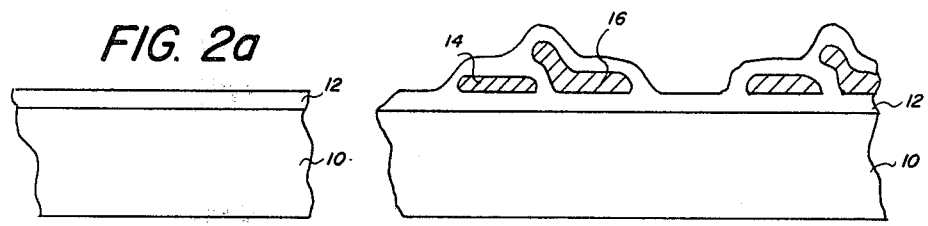
FIG. 3a    FIG. 3b
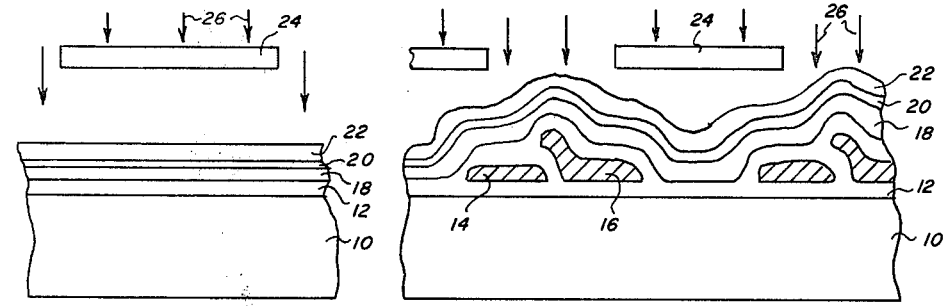
FIG. 4a    FIG. 4b
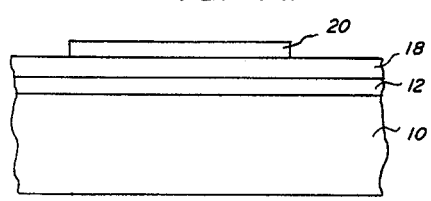
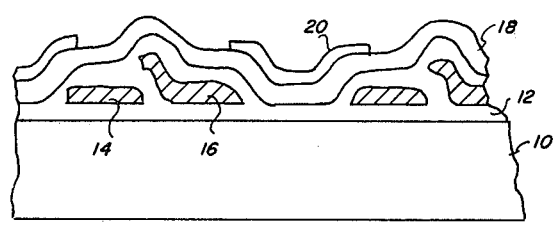

METHOD OF FABRICATING A TRANSPARENT METAL OXIDE ELECTRODE STRUCTURE ON A SOLID-STATE ELECTROOPTICAL DEVICE

BACKGROUND OF THE INVENTION

1. Field of the Invention

The present invention relates to the fabrication of solid-state electrooptical devices and more particularly to a method of fabricating transparent metal oxide electrodes on such devices.

2. Discussion Related to the Problem

Solid-state electrooptical devices, such as charge coupled device (CCD) image sensing arrays, in which light passes through, or around a gate electrode on the device, are well known. In the earliest of such devices, the gate electrodes were aluminum and therefore opaque. Small gaps were left between the electrodes through which light could pass. The presence of these small gaps caused serious problems in manufacturing the devices and imposed limitations on the performance of the devices. Shorts frequently occurred across the narrow gaps between the electrodes, rendering the devices useless. The presence of the bare gaps caused fringing fields in the devices that reduced their charge transfer efficiency. Finally, the relatively small light responsive surface area of the devices severely restricted their light gathering efficiency.

An improvement in the manufacturability and performance of front illuminated CCD image sensing arrays was achieved by the use of semitransparent polysilicon as the electrode material. The article entitled "Charge Coupled Area Image Sensor Using Three Levels of Polysilicon" by C. H. Sequin et al, IEEE Transactions on Electronic Devices, Vol. ED 21, No. 11, Nov. 1974, describes a three-phase CCD image sensor using three levels of semitransparent polysilicon electrodes. With the semitransparent electrode material, gaps between the electrodes were no longer required to allow light to enter the device from the front side. As a result, the electrodes were allowed to slightly overlap (with an interposed layer of insulating material such as SiO$_2$) thereby reducing the probability of shorts between the electrodes, and greatly improving the transfer efficiency of the device by reducing the fringing fields caused by gaps between the electrodes.

The polysilicon electrodes still had the disadvantage that they were only semitransparent, some of the light reaching the surface of the device was absorbed by the electrode structure and therefore the light gathering efficiency of the device was limited. A proposed solution to this problem was to use a more transparent conductive material such as indium oxide or tin oxide for the electrodes. Unfortunately, there are several problems associated with the use of a transparent conductive metal oxide for the electrodes in an electrooptic device. For one thing, conventional photoresists may not adhere at all well to the metal oxide layers in the presence of the concentrated or hot acids commonly required to etch these layers, making patterning by photolithography difficult. A second problem is that the contacts between the transparent metal oxide electrode structure and the final metal layer on the bonding pads (e.g. aluminum) tend to form insulating oxide interfaces (e.g. aluminum oxide) at the bond due to the reduction of the transparent metal oxide by the aluminum, thereby destroying electrical contact to the electrodes. A third problem is the need to pattern the final metallization layer without affecting the transparent metal oxide electrodes, in light of the fact that the transparent metal oxide electrodes are attacked by conventional metal etchants in the presence of a strongly reducing metal such as aluminum.

U.S. Pat. No. 3,941,630 issued to R. D. Larrabee on Mar. 2, 1976, discloses one method of patterning transparent metal oxide electrodes in a CCD image sensing device. According to the method disclosed by Larrabee, a transparent metal oxide layer is deposited on the surface of the device, and the metal oxide layer is covered with a thin layer of aluminum. The aluminum is patterned using photolithographic techniques and an etchant that does not substantially attack the transparent metal oxide. The remaining aluminum is anodized, leaving a transparent insulating pattern of aluminum oxide on the transparent metal oxide. The aluminum oxide pattern is then employed as a resist to pattern the transparent metal oxide, leaving a pattern of transparent metal oxide electrodes covered by an insulating layer of transparent aluminum oxide. While providing a method for patterning transparent metal oxide electrodes, this method does not solve the second problem noted above. That is, the problem of forming contacts between the metal oxide electrodes and the final metal layer on the bonding pads of the device. Rather, the method leaves an insulating layer of aluminum oxide covering the transparent metal oxide electrodes.

SOLUTION OF THE PROBLEM—SUMMARY OF THE INVENTION

The problems noted above are solved according to the present invention by depositing a layer of transparent conductive metal oxide on the surface of an image sensing device. Thereafter, the transparent metal oxide layer is covered with a layer of pattern metal that forms a good electrical contact with the transparent metal oxide and can be etched independently of the transparent metal oxide. Portions of the pattern metal are etched away to define the desired electrode pattern using a photolithographic technique and an etchant that attacks the pattern metal but does not substantially attack the transparent metal oxide. Portions of the transparent metal oxide layer not covered by the pattern metal are removed using an etchant that attacks the transparent metal oxide but does not substantially attack the pattern metal, thus using the pattern metal as a highly adherent resist. Portions of the remaining pattern metal are removed from the imaging areas of the device, leaving pattern metal in the peripheral areas where contacts are to be made to the transparent electrodes, using photolithographic techniques and the etchant that attacks the pattern metal, but not the transparent metal oxide.

According to a preferred embodiment of the invention, the pattern metal comprises chromium. A final layer of metal (e.g. gold) is deposited over the structure, and the structure is baked to adhere the final metal to the remaining chromium. Finally, portions of the final metal are removed leaving the desired conductor patterns and the bonding pads. In the preferred embodiment, the layer of chromium is approximately 1000 Å thick; the chromium etchant is a mixture of nitric acid, water, and ceric ammonium nitrate; the transparent metal oxide etchant is hydrochloric or hydroiodic acid; the final metal is gold; and the final metal etchant is a solution of potassium polyiodide. In an alternative embodiment, the final metal is aluminum; and the final metal etchant is a halide containing plasma.

BRIEF DESCRIPTION OF THE DRAWINGS

The invention will be described with reference to the drawings, wherein:

FIG. 1a is a highly simplified schematic diagram of the top electrode structure of the CCD image sensor fabricated according to the present invention;

FIG. 1b is a highly simplified schematic diagram of the final metal structure of a CCD image sensor fabricated according to the present invention;

FIGS. 2a–7a are cross-sectional views of a portion of the three-phase CCD image sensing device, taken along lines A—A in FIGS. 1a and b showing the fabrication of a conductor portion of the device; and FIGS. 2b–7b are cross-sectional views of a portion of the three-phase CCD image sensing device taken along line B—B in FIG. 1a, showing the fabrication of an image sensing electrode in the device.

DESCRIPTION OF THE PREFERRED EMBODIMENT

Figure 5A:
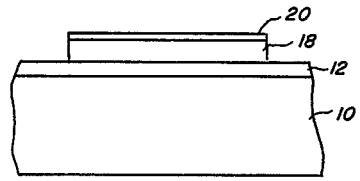
Figure 5B:
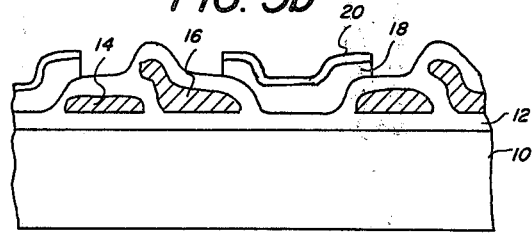

The preferred process of fabricating metal oxide electrodes according to the present invention commences, in the sequence of making an electrooptical device, at the point where the final or topmost electrode structure is to be fabricated. The preferred embodiment of the invention will be described with reference to the manufacture of a three-phase CCD image sensor as described in the abovereferenced article by Sequin et al. FIG. 1a is a highly simplified schematic diagram representing the pattern of the top electrode structure of the three-phase CCD image sensor. The vertical segments 1, extending from the horizontal portion 2, represent the transparent electrodes in the image sensing area of the device. Horizontal portion 2 is a conductor that electrically interconnects the top electrodes. FIGS. 2a–8a and 2b–8b shown cross-sections of the device in process taken along lines A—A and B—B in FIG. 1a, in the area of the conductor 2 and the transparent electrode structure 1, respectively.

FIGS. 2a and b show a cross-section of the device in process after the first two levels of polysilicon have been patterned to form the phase 1 and phase 2 electrodes of the device. Up to this point, the device processing method has been according to the prior art, as described in the abovereferenced Sequin et al article. The device in process comprises a substrate 10 of appropriately doped silicon (for example p type silicon 10–20 $\Omega/\square$), a layer of silicon dioxide 12 covering the substrate, and first and second phase polysilicon electrodes 14 and 16, respectively, embedded in the silicon dioxide layer. Fabrication of the third phase electrode structure from the transparent metal oxide layer according to the present invention proceeds from this point. Turning now to FIGS. 3a and b, the first step in the method is to deposit on the device a layer of transparent metal oxide 18 such as $SnO_2$, $In_2O_3$, $CdO$, $Sb_2O_3$, or mixtures of these. The metal oxide layer 18 is then covered with a layer of pattern metal 20. The pattern metal adheres to the transparent metal oxide forming a good electrical contact therewith, and is capable of being etched independently of the transparent metal oxide thereby functioning as a resist. Metals suitable for use as the pattern metal are found in the group of transition elements, and include those metals having a relatively high oxidation potential, such as titanium, chromium, tungsten and molybdenum, which upon reducing the transparent metal oxide, produce conductive oxides of their own, and also those metals having a relatively low oxidation potential, such as platinum and gold, which are substantially nonreactive with the transparent metal oxides. Mercury, although a transition metal, has too low a melting point to be useful for practicing the invention.

The layer of pattern metal 20 is deposited on the transparent metal oxide layer 18 by any of the well known deposition techniques such as sputtering, evaporation, spraying, electroplating, or electroless deposition. The layer 20 is patterned to the required third phase electrode pattern using photolithography. The layer of pattern metal is covered with a layer of photoresist 22 and the photoresist is exposed through a mask 24 by actinic radiation 26. The mask 24 resembles FIG. 1a, being opaque to actinic radiation in the electrode structure areas and transparent elsewhere. The photoresist is then removed from areas of exposure using conventional techniques. Turning to FIGS. 4a and b, the pattern metal not protected by the remaining photoresist is removed in an etchant that does not attack the transparent metal oxide layer 18.

Figure 6A:
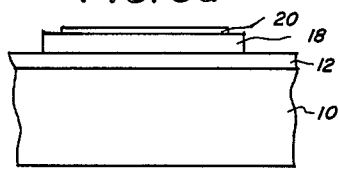
Figure 6B:
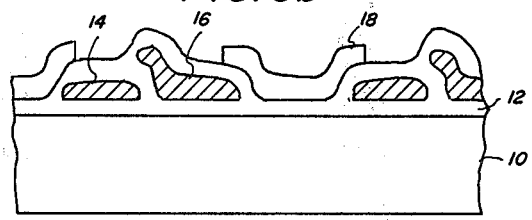
Figure 7A:
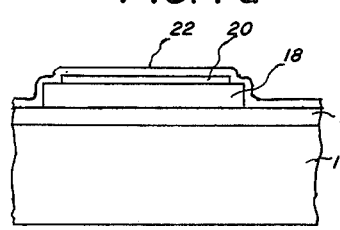
Figure 7B:
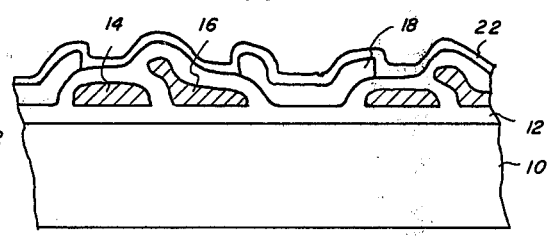
Figure 8A:
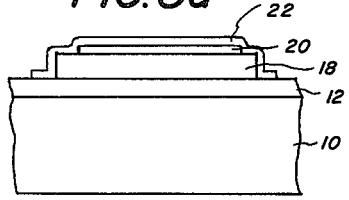
Figure 8B:
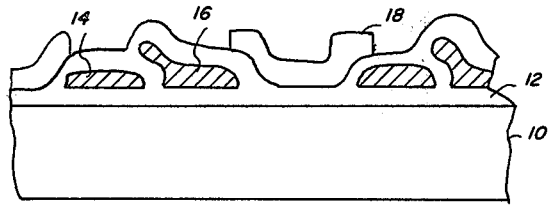

Suitable etchants are found in the class of redox solutions stable in a neutral or weakly acid or alkaline solution, such as $I_2$—$KI$; $K_3Fe(CN)_6$—$K_4Fe(CN)_6$; $C_6H_4O_2$—$C_4H_6O_2$ (quinone-hydroquinone); $FeCl_3$—$FeCl_2$; and $Ce(NO_3)_2$—$Ce(NO_3)_3$. The unexposed photoresist is removed from the pattern metal and the remaining pattern of metal is used as an inert, highly adherent, resist while the transparent metal oxide layer 18 is etched to the final electrode pattern using an etchant that attacks the transparent metal oxide at a much faster rate than the pattern metal. The resulting structure is shown in FIGS. 5a and b. The pattern metal is again patterned using photolithography and the selective etchant to remove the pattern metal from the active imaging areas of the device, but not from the conductor areas where electrical contacts are to be made. The resulting transparent metal oxide electrode structure 18 and conductors covered with pattern metal 20 are shown in FIGS. 6a and b. To complete the circuit, and form the bonding pads, a final layer of metal 22 is deposited over the surface of the structure as shown in FIGS. 7a and b. The structure is then baked at about 300° C. to promote adhesion of the final metal to the pattern metal. The final metal is patterned using photolithography and an etchant that attacks the final metal but not the transparent metal oxide. A mask resembling FIG. 1b is used to pattern the final metal layer. As shown in FIG. 1b, a peripheral bonding pad 3 is electrically connected to a conductor 4 by an interconnect line 5. Conductor 4 is disposed over, and makes electrical contact with, the conductor 2 of FIG. 1a. The final structure is shown in FIGS. 8a and b.

EXAMPLES

Example 1

The transparent metal oxide is cadmium-tin oxide prepared by simultaneously sputtering CdO and $SnO_2$ onto the substrate in the approximate proportions of 30% $SnO_2$ and 70% CdO by weight.

The pattern metal is chromium, deposited over the transparent metal oxide approximately 1000 Å thick by sputtering or evaporation. The chromium etchant is a mixture of nitric acid (4%), water (80%), and ceric ammonium nitrate (16%). The transparent metal oxide etchant is hydrochloric or hydroiodic acid. The final metal is gold; and the final metal etchant is a concentrated solution of potassium polyiodide.

Example 2

The same as Example 1, except that the final metal is aluminum, and the final metal etchant is a halide-containing plasma such as carbon tetrachloride, applied using standard plasma etching techniques. Such a plasma does not attack the transparent metal oxide.

Example 3

The pattern metal is gold; and the pattern metal etchant is potassium polyiodide. The transparent metal oxide etchant is hydrochloric or hydroiodic acid. The final metal is gold or aluminum as in Examples 1 and 2 respectively.

The invention has been described in detail with reference to a preferred embodiment thereof, however, it will be understood that variations and modifications can be effected within the spirit and scope of the invention. For example, although the invention has been described with respect to patterning transparent metal oxide electrodes on a light sensitive device, i.e. an image sensor, the method may also be used to pattern transparent metal oxide electrodes on light emitting devices such as LED's.

What is claimed is:

1. A method of fabricating an electrode structure of transparent metal oxide on a solid-state electrooptic device of the type having transparent gate electrodes through which light passes to expose the device, comprising the steps of:
   depositing a layer of conductive transparent metal oxide on the device;
   depositing a layer of pattern metal comprising a transition metal capable of forming a good electrical contact with the transparent metal oxide, and capable of being etched independently of the transparent metal oxide;
   removing by etching, portions of the pattern metal to define a desired electrode pattern employing photolithographic techniques using an etchant that attacks the pattern metal, but does not substantially attack the metal oxide layer;
   removing by etching, the portions of the metal oxide layer not covered by the pattern metal, using an etchant that attacks the transparent metal oxide but does not substantially attack the pattern metal;
   further removing by etching, portions of the pattern metal from optically active areas of the device, but leaving pattern metal in the peripheral areas of the electrode structure where electrical contacts are to be made, using photolithographic techniques and an etchant that attacks the pattern metal but not the transparent metal oxide;
   depositing a final layer of metal over the structure;
   baking the structure at a temperature sufficient to promote adhesion of the final metal layer to the pattern metal; and
   etching away portions of the final metal layer to define electrical conductive paths and bonding pads.

2. The invention claimed in claim 1, wherein the transparent metal oxide layer is a material selected from the group consisting of $SnO_2$, $In_2O_3$, CdO, $Sb_2O_3$, and mixtures of these and the transparent metal oxide etchant is hydrochloric or hydroiodic acid.

3. The invention claimed in claim 2 wherein the pattern metal is chromium, and the chromium etchant is a mixture of nitric acid, water and ceric ammonium nitrate.

4. The invention claimed in claim 2, wherein the pattern metal is gold, and the gold etchant is potassium polyiodide.

5. The invention claimed in claim 1 wherein the final metal layer is gold.

6. The invention claimed in claim 5 wherein the final metal etchant is a solution of potassium polyiodide.

7. The invention claimed in claim 1 wherein the final metal is aluminum.

8. The invention claimed in claim 7 wherein the final metal etchant is a halide containing plasma.

9. The invention claimed in claim 8 wherein the halide-containing plasma is produced from carbon tetrachloride.

10. A solid-state electrooptic device of the type having a patterned electrode structure of transparent metal oxide through which light passes to expose the device, with peripheral areas covered by a metal, for electrical contact to the metal oxide electrode structure, formed by the process of:
    depositing a layer of conductive transparent metal oxide on the device;
    depositing a layer of pattern metal comprising a transition metal capable of forming a good electrical contact with the transparent metal oxide, and capable of being etched independently of the transparent metal oxide;
    removing by etching, portions of the pattern metal to define a desired electrode pattern employing photolithographic techniques using an etchant that attacks the pattern metal, but does not substantially attack the metal oxide layer;
    removing by etching, the portions of the metal oxide layer not covered by the pattern metal, using an etchant that attacks the transparent metal oxide but does not substantially attack the pattern metal;
    further removing by etching, portions of the pattern metal from optically active areas of the device, but leaving pattern metal in the peripheral areas of the electrode structure where electrical contacts are to be made, using photolithographic techniques and an etchant that attacks the pattern metal but not the transparent metal oxide;
    depositing a final layer of metal over the structure;
    baking the structure at a temperature sufficient to promote adhesion of the final metal layer to the pattern metal; and
    etching away portions of the final metal layer to define electrical conductive paths and bonding pads.

* * * * *